United States Patent [19]

Nakazawa et al.

[11] 4,385,838

[45] May 31, 1983

[54] ALIGNMENT DEVICE

[75] Inventors: Kiwao Nakazawa, Tokyo; Akikazu Tanimoto, Kawasaki, both of Japan

[73] Assignee: Nippon Kogaku K. K., Tokyo, Japan

[21] Appl. No.: 225,049

[22] Filed: Jan. 14, 1981

[30] Foreign Application Priority Data

Jan. 19, 1980 [JP] Japan .................................. 55-5156
Nov. 7, 1980 [JP] Japan .............................. 55-156575

[51] Int. Cl.$^3$ ............................................. G01B 11/00
[52] U.S. Cl. ..................................... 356/399; 356/401
[58] Field of Search ............................... 356/399–401, 356/363, 375, 356, 358; 250/561; 350/81

[56] References Cited

U.S. PATENT DOCUMENTS 3,600,811  8/1971  Weyrauch .............................. 350/81
4,074,131  2/1978  Schwebel ............................ 356/375

OTHER PUBLICATIONS

Fredriksen, T. R. "New Wafer Alignment Technique" Microelectronics & Reliability, vol. 15 #2, 1976, pp. 147-151.
Anon, "IC Pattern Printing Techniques Improving" JEE #111, 3/76, pp. 35-36.

Primary Examiner—William H. Punter
Attorney, Agent, or Firm—Shapiro and Shapiro

[57] ABSTRACT

An alignment device for registering an object to a predetermined position with high precision and for calculating inclination of the object with respect to its predetermined position, which is constructed with a moving device for mounting thereon the object and moving the same two-dimensionally, a coordinate measuring device having orthogonally intersecting first and second measuring axes to measure the coordinates of the moving device in both directions of orthogonally intersecting first and second measuring axes of the object, an observing device having a first observing optical system with the center of observation (the first observation center) thereof being substantially on the first measuring axis and a second observing optical system with the center of observation (the second observation center) thereof being substantially on the second measuring axis, and a setting device to set, on the coordinate measuring device, the coordinate values of the first and second observation centers with the substantial intersection of the first and second measuring axes as the origin point, by detection, through movement of the moving device, of any one of a plurality of first marks on the object along the first axis when it is positioned at the first observation center, and of any one of a plurality of second marks along the second axis when it is positioned at the second observation center, thereby making the established coordinate values the references for movement of the moving device.

8 Claims, 15 Drawing Figures

ALIGNMENT DEVICE

BACKGROUND OF THE INVENTION

1. Field of the Invention

This invention relates to an alignment device, and, more particularly, it is concerned with an alignment device suitable for a step-and-repeat type printing device which transfers patterns of integrated circuits, etc. drawn on glass substrates onto silicon wafers.

2. Description of the Prior Art

Year by year, patterns of large-scaled integrated circuits (LSI) tend to become more miniaturized. As one of the lithographic techniques in answer to demands for such miniaturization, attention has been paid to an optical scale-reduction and projection technique. There have so far been promulgated various devices for performing the pattern printing based on this technique (the so-called "scale-reduction and optical printing device"). In these devices, a reticle pattern of a size several times (e.g. ten times) as large as that of a pattern (chip pattern) to be actually printed is projected in a reduced scale onto a silicon wafer (hereinafter simply called "wafer") by an image projecting lens, and printed. In this case, a region that can be printed on the wafer in a single exposure is no more than 14 mm or so in diameter. In order therefore to print the pattern on the entire surface of the wafer, there has been adopted the so-called step-and-repeat system, wherein the wafer mounted on a printing stage is shifted for a certain definite distance, and the exposure operations were repeated a plurality of times.

Also, in the production of the LSI circuit elements, patterns in a plurality of layers are printed in superposition. In this case, unless errors in superposition among the layers are kept below a predetermined value, the function of the resulting LSI element would inevitably be impaired. For instance, for a pattern having the minimum line width of 1 micro-meter, the permissible error in superposition should be 0.2 micro-meters or so at the maximum. Of course, the less this error is, the better. For successively overlaying such plurality of pattern layers, a device for aligning or registering a pattern to be subsequently printed on that pattern which has already been printed on the wafer, i.e., an alignment device, is necessary. For the sake of good understanding, therefore, there will be given hereinbelow explanations on a conventional device which carries out such exposure and printing.

FIG. 1 of the accompanying drawings is a perspective view showing a schematic construction of the conventional device. A reticle R1, on which a pattern has been drawn in the central portion, is positioned above a projection lens L1. An exposure light source (not shown) is positioned further above the reticle R1. The reticle R1 is provided with two transparent parts 30, 31 on its peripheral portion. Each of the transparent parts has a mark 30x, 31y, respectively. Below the projection lens L1, there is disposed a stage S1 which is capable of moving two-dimensionally. A rotational table 32 is so provided in the stage S1 that it may slightly rotatable relative to the stage S1. (The table 32 is deleted in FIGS. 2, 3 and 4 to avoid complication of the drawing.) A reticle-x microscope RX1 and a reticle-y microscope RY1 have, on the real image planes, reference marks for defining the center of observation, respectively, and are so disposed that the center of observation of each microscope coincides with each axis of the orthogonally intersecting coordinate axis system x-y, as shown in FIG. 1, and detect marks 30x, 31y on the reticle R1, respectively, so as to place the reticle R1 at its predetermined position. Here, it is assumed that the coordinate axes X, Y denote the position of the stage S1 with respect stationary coordinate system. It is also assumed that the axis X and the axis Y of the X-Y coordinate system substantially coincide with the center axes of two laser beams from laser interferometers, 33, 34 and that the intersection of the axis X and the axis Y is adjusted so as to substantially coincide with the optical center of the projection lens L1.

Mirrors 5, 6 fixed to the stage S1 are so arranged as to orthogonally intersect each other. The surfaces of the mirrors 5, 6 are perpendicular to the axes X and Y, namely the laser beams of the laser interferometers 33 and 34.

Relative positioning of the coordinate system x-y and the coordinate system X-Y is done by use of a cross mark C1 fixed on the stage S1. More specifically, when the stage S1 is so moved that the image of the cross mark C1 through the projection lens L1 coincides with the center of observation of the microscope RX1, the position of the stage S1 relative to axis X is measured by the interferometer 33. The relative positions of the axis Y and the axis y can also be determined in the same manner.

By the side of the projection lens L1, there are disposed microscopes WXY and W$\theta$1, each having an optical axis which is substantially parallel with the optical axis of the projection lens L1.

The microscopes WXY, W$\theta$1 are provided with reference marks "+" and "−" on the real image plane thereof, respectively, as shown in FIG. 2. The reference marks "+" "−" serve as the observation centers of the microscopes WXY, W$\theta$1.

When a wafer W1 is set on the rotational table 32 of the stage S1 in FIG. 2, the microscope WXY is used to determine the position of the wafer with respect to the axes X and Y of the coordinate system X-Y, and the microscope W$\theta$1 is used to determine the rotational position of the wafer. The cross mark C1 is brought to the center of observation of the microscope WXY by moving the stage S1. At this instant, when the values of coordinates of the stage S1 in the coordinate system X-Y are measured by the interferometers 33, 34, the position of the center of observation of the microscope WXY can be found. Subsequently, the stage S1 is moved only in the direction X of the coordinate system X-Y to view the cross mark C1 by the microscope W$\theta$1. Then, the center of observation of the microscope W$\theta$1 in the direction Y is moved so that it may coincide with the line 1 in the cross mark C1 extending in the direction X. In this manner, adjustment for coinciding the center of observation in the direction Y of both microscopes WXY and W$\theta$1 is carried out. In this adjusted condition, the wafer is mounted on the rotational table 32 of the stage S1 and the positioning, i.e., alignment, of the wafer will be performed.

FIG. 2 is a top plan view of the device shown in FIG. 1, wherein the wafer W1 is mounted on the stage S1. It should be understood that an X-Y alignment mark 3 (hereinafter simply referred to as "XY-mark 3") and a $\theta$ alignment mark 4 (hereinafter simply referred to as "$\theta$-mark 4") are provided in advance at positions on the wafer W1 corresponding to the center of observation of the microscopes WXY, W$\theta$1, respectively. The stage S1 is then shifted from its state shown in FIG. 2 to the state shown in FIG. 3. Subsequently, the wafer W1 is rotated by rotation of the rotational table in such a manner that the microscopes WXY, Wθ1 become able to view the XY-mark 3 and the θ-mark 4 at their respective centers of observation. When the XY-mark 3 and the θ-mark 4 are exactly positioned by the wafer rotation, the coordinate position of the stage S1 is measured by the interferometers 33, 34, and the value is memorized. By finding the difference between this memorized coordinate position and the coordinate position of the center of observation of the microscope WXY, the position of the wafer W1 with respect to the coordinate system X-Y is determined. In this way, the position of the wafer W1 can be determined accurately with respect to the XY-mark 3 and the θ-mark 4. However, should there be accompanied yawing at the time of movement of the stage S1, errors in the positioning would inevitably occur. This will be explained briefly in the following.

Generally speaking, since this type of stage is required for high speed movement, there exists a yawing of approximately 0.5 second in terms of an angular movement, even with the most precisely manufactured stage. Further, depending on the stage, the yawing takes place when the direction of movement of the stage changes, and the quantity of yawing varies depending on the speed of the stage movement. Furthermore, the nature of the yawing generally differs from stage to stage.

As an example, it is assumed that a distance LY1 from the axis X of the coordinate system X-Y to the microscope WXY is 70 mm. It is further assumed that yawing of 0.5 second would occur when the stage S1 is so moved that the cross mark C1 varies from its position just above the axis X to its position right beneath the microscope WXY. Under these conditions, the Abbé error becomes approximately 0.17 micro-meter $(70 \times 10^{-3} \times 0.5/60^2 \times \pi/180)$. Accordingly, the alignment standard of the wafer W1 in the direction X deviates by a quantity equal to this error with respect to the coordinate system X-Y, whereby the wafer W1 which is aligned in accordance with this standard would have the same quantity of error (alignment error) in the direction X. The microscopes WXY, Wθ1 are disposed at their respective positions away from the axis Y of the coordinate system X-Y. In consequence of this, there would also take place the same deviation in alignment, due to the same Abbe error as mentioned above, in the direction Y, i.e., the rotational direction, of the wafer W1.

As explained in the foregoing, the alignment error in the wafer constitutes a problem when the patterns in a plurality of layers are to be printed in superposition by one and the same printing device. This problem also takes place when the patterns in a plurality of different layers are to be printed by different printing devices, which hinders interchangeability of the printing device.

In the following, an explanation will be given with reference to FIG. 4 as to why the microscopes WXY, Wf1 are disposed at their respective positions away from the axes X, Y.

FIG. 4 shows a similar layout as in FIG. 3. In general, the projection lens L1 is required to have an effective diameter of 14 mm for its projecting plane so that a square pattern region of about 10 mm square may be printed on the wafer W1. Further, within the circle of this effective diameter, the projection lens L1 should be able to project a pattern on the wafer W1 under the telecentric condition and print thereon the same having a line width as thin as approximately 1 micro-meter. Therefore, the projection lens L1 should eventually have a diameter D which is greater than a predetermined value. Actually, the value of the diameter D is 100 mm or so, and it is difficult to be made smaller than this. A diameter d of the microscopes WXY, Wθ1 should be at least 20 mm or so. At the time of the wafer W1 alignment, the spacing between the microscopes WXY and Wθ1 is preferably as long as possible for accurate measurement of the rotational error of the wafer W1. That is, if the size of the wafer W1, on which a pattern is to be printed, is taken to be three inches (approx. 76.2 mm), the spacing (2·LX1) between the microscopes WXY and Wθ1 should be made as close to three inches as possible. Therefore, when the interval 2·LX1 is set to approximately 70 mm, the microscopes WXY and Wθ1 would deviate from the Abbe condition by $LX1 \approx 35$ mm. Furthermore $(D+d)/2 \approx 60$ mm or longer would be required for a distance LY1 from the axis X to the center of observation of the microscope WXY. In reality, the distance $LY1 \approx 70$ mm or so is the minimum length in consideration of parts to hold the microscopes WXY and Wθ1. Accordingly, they are deviated from the Abbé condition by the amount of distance LY1.

SUMMARY OF THE INVENTION

It is therefore a primary object of the present invention to provide a device for aligning an object to a predetermined position with good precision.

It is a secondary object of the present invention to provide an alignment device capable of accurately measuring the inclination of an object with respect to its predetermined position.

It is tertiary object of the present invention to provide an alignment device adaptable to a step-and-repeat type printing device for manufacturing an integrated circuit (IC).

DETAILED DESCRIPTION OF PREFERRED EMBODIMENT

Figure 1:
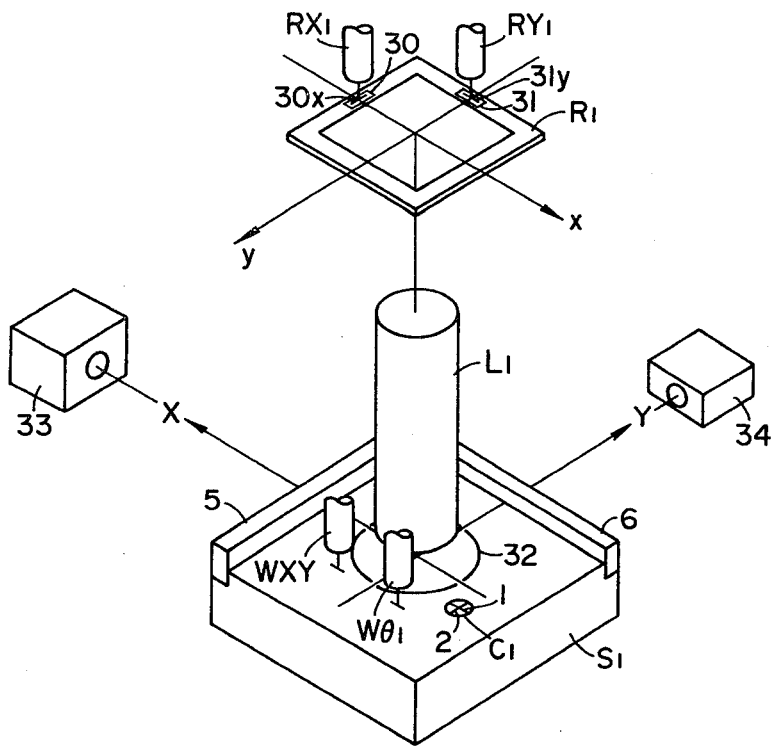
FIG. 1 is a perspective view of a step-and-repeat type exposure device, in which a conventional alignment device is used.
Figure 2:
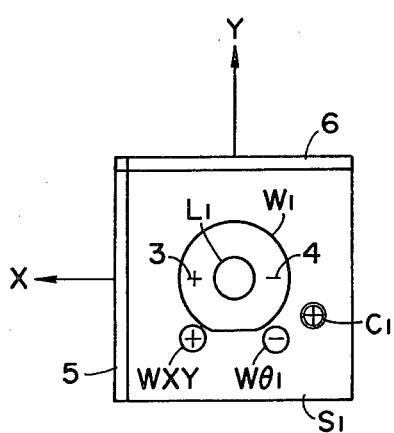
FIG. 2, 3 and 4 are respectively top plan views of the device shown in FIG. 1, which illustrate the manner of aligning operations.
Figure 3:
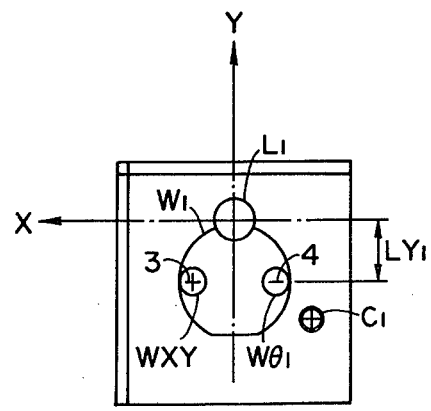
Figure 4:
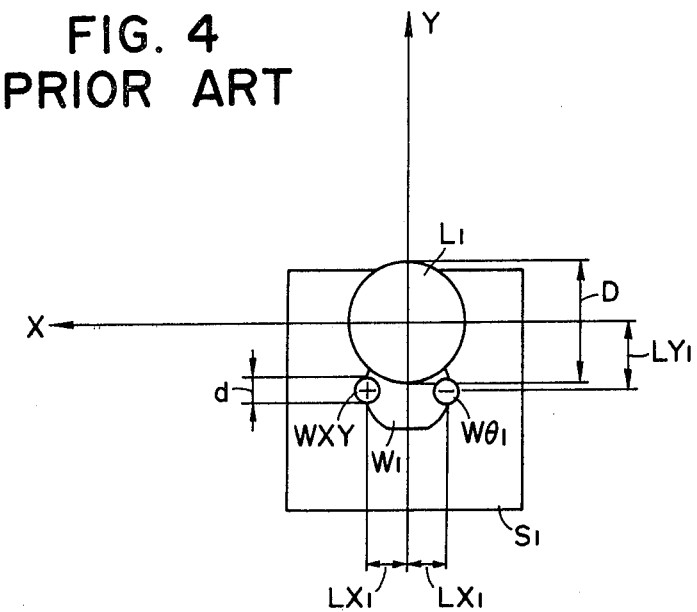
Figure 5:
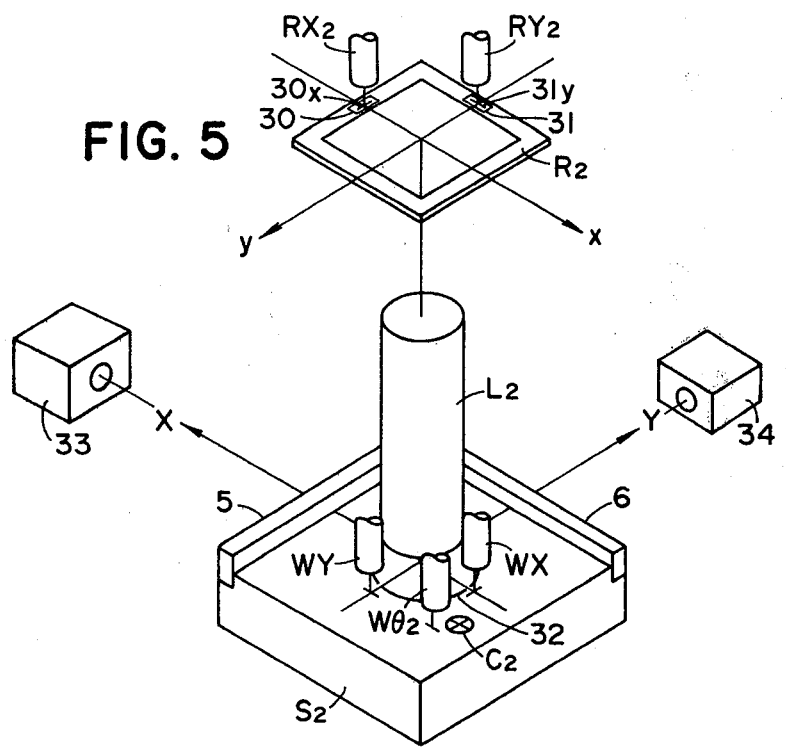
FIG. 5 is a perspective view of an exposure device, in which an aligning device according to a preferred embodiment of the present invention is used.

Referring to FIG. 5, showing an arrangement of an alignment device according to the present invention, the layout and operations of the stage S2, projection lens L2, reticle R2, reticle-x microscope RX2, reticle-y microscope RY2, and $\theta$ microscope W$\theta$2 to detect rotation of the wafer at a time of its alignment are same as those in the conventional alignment device in FIG. 1. The point of difference from the conventional device is that a microscope WX to detect the wafer in its direction X, and a microscope WY to detect the wafer in its direction Y are provided instead of the conventional X-Y microscope WXY. In FIG. 5, the X-microscope WX and the Y-microscope WY are disposed in such a manner that the center of observation of these microscopes may be respectively coincident with the axes X and Y which substantially are the center axes of two laser interferometers 33, 34.

Figure 6:
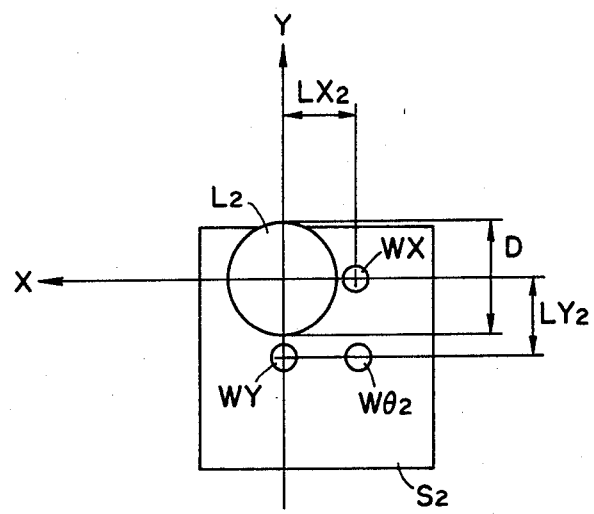
FIG. 6 is a top plan view of the alignment device shown in FIG. 5.

FIG. 6 is a top plan view showing the layout of the device shown in FIG. 5. The origin of the coordinate system X-Y is positioned at the optical center of the projection lens L2. Since the X-microscope WX is so disposed that its observation center is positioned on the axis X and the Y-microscope WY is so disposed that its observation center is positioned on the axis Y, there is no possibility of error due to deviation from the Abbé condition, even when the values of a distance LX2 between the X-microscope WX and the axis Y and the distance LY2 between the Y-microscope WY and the axis X are made large. This means that the diameter D of the projection lens L2 can be optimized from the design point of view (e.g. D=120 mm). Incidentally, the distance LY2 between the Y-microscope WY and the axis X is preferably substantially equal to the distance between the $\theta$-microscope W$\theta$2 and the axis X.

Figure 7:
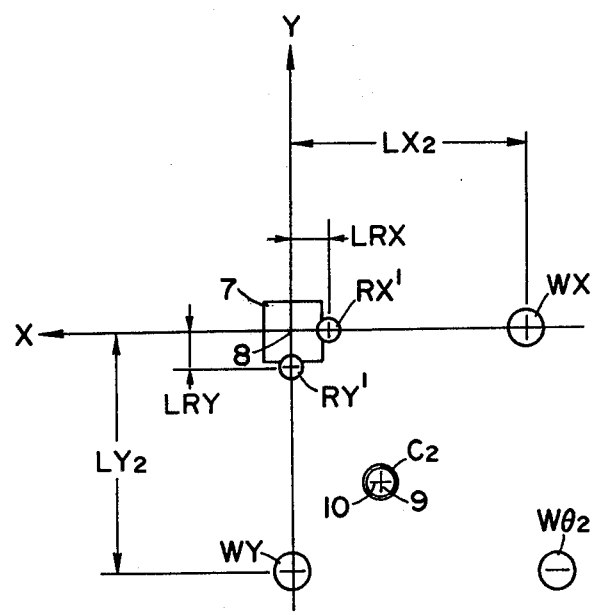
FIG. 7 is a layout diagram of an observing means in the alignment device according to the preferred embodiment of the present invention.

FIG. 7 is also a layout diagram which further details the layout shown in FIG. 6. This diagram shows each of the following relationships: (1) an actual position of a projected image 7 of the reticle pattern of the reticle R2 with respect to the X-Y axes; (2) the position of a part RX' to be observed by the reticle-x microscope RX2 shown in FIG. 5 through a transparent portion 30 of the reticle R2 and the projection lens L2; and (3) a position of a part RY' to be observed by the reticle-y microscope RY2 through a transparent portion 31 of the reticle R2 and the projection lens L2. The parts RX' and RY' to be observed are those of the reticle R2 which are observed by the x-microscope RX2 and the y-microscope RY2, and which are projected on the wafer W2 by the projection lens L2. Therefore, these observing parts RX' and RY' will hereinafter be simply called "projection RX'" of the reticle-x microscope RX2 and "projection RY'" of the reticle-y microscope RY2. What should be noted here are that the center of observation of the x-microscope WX, the projection RX', and the center 8 of the projected image 7 coincide with the axis X, and that the center of observation of the Y-microscope WY, the projection RY', and the center 8 of the projected image 7 coincide with the axis Y. Accordingly, when the cross mark C2 on stage S2 or the alignment mark on the wafer is thus detected on the measuring axes X and Y to measure the position of the stage S2 to carry out measurement of the coordinate position of the stage S2, there takes place no Abbe error. The positional relationship among the X-microscope WX, Y-microscope WY, $\theta$-microscope W$\theta$2, x-microscope RX2, and y-microscope RY2 can be set by the cross mark C2 fixed on the stage S2. In such case when light which has the same wavelength as that of the light used in the pattern projection (pattern exposure) is caused to pass through the transparent portions 30, 31, and the projection lens L2 to thereby illuminate the cross mark C2, the mark can be accurately measured by the microscopes RX2, RY2 because the aberration of the projection lens L2 is corrected with respect to the abovementioned wavelength.

As stated in the foregoing, the axes X, Y of the X-Y coordinate system are so determined that they may substantially coincide with the center axes of the laser beams from the two laser interferometers 33, 34 and be perpendicular to the surfaces of the mirrors 5, 6. However, since the diameter of each beam in its cross-section is of an order of a few milli-meters, and the beam intensity in its cross-sectional-wise dimension has a Gaussian distribution, it is not possible to find out the center axis of the beam and bring it to a precise registration with the axes X and Y. It is therefore contemplated that, instead of adopting the center axes of the beams per se as the axes X and Y, the center 8 of projection 7 of the reticle R2 is brought to approximately the intersection of the two beams and made the origin of the X-Y coordinate system, and that two axes passing through this origin point and being parallel with the axes perpendicular to the surface of two mirrors 5, 6 are adopted as the axes X and Y. In this way, the position of the X-Y coordinate system with respect to the actual printing device can be established the required precision. By the way, the center point 8 of projection 7 of the reticle R2 may be either the center of the outer circumference of the pattern existing region of the reticle R2, or the center of the outer circumference of the pattern existing region including the marks 30x, 31y for the wafer alignment, provided that the method of determination should be unified in a set of reticles (masks) to be used for manufacturing one type of LSI. From the above, the positions of the projection RX' of the x-microscope RX2 and the projection RY' of the y-microscope RY2 with respect to the center 8 of the projected image 7 can be easily determined with an error of 0.1 micrometer or less.

The reason for the above will be briefly mentioned in the following:

(1) a plurality of marks 30x, 31y are provided on the reticle R2 with a precision of 0.1 micro-meter or so with respect to the center of the reticle R2; (2) the reticle R2 is so set that the centers of these marks may be coincident with the centers of observation of the x-microscope RX2 and the y-microscope RY2; and (3) the projection magnification of the reticle R2 due to the projection lens L2 is so determined that the distance between the center 8 of the projected image 7 and the center of the projection RX', and the distance between the center 8 and the center of the projection RY' may be within an error of 0.1 micro-meter or below.

Assume now that the distance between the center 8 and the center of the projection RX' is LRX, and the distance between the center 8 and the center of the projection RY' is LRY. Here, the cross mark C2 is caused to pass right below the projection RX' of the reticle-x microscope RX2 and the X-microscope WX by moving the stage S2. Then, when the vertical line 9 of the cross mark C2 crosses the center of the projection RX' and the center of observation of the X-microscope WX, the two positions in the direction X of the stage S2 are measured by the laser interferometer 33 from which positional difference the distance between the center of the projection RX' and the center of the X-microscope WX is found. By adding the distance LRX to this distance value as found, there can be obtained the distance LX2 between the X-microscope WX and the axis Y as shown in FIG. 7.

In the same manner, by moving the stage S2, the cross mark C2 is caused to pass right below the projection RY' of the y-microscope RY2 and the Y-microscope WY. Then, when a horizontal line 10 of the cross mark C2 crosses the center of the projection RY' and the center of observation of the Y-microscope WY, the two positions in the direction Y of the stage S2 are measured by the interferometer 34, from which positional difference the distance between the center of projection RY' and the center of the Y-microscope WY is found. By adding the distance LRY to this distance value as found, there can be obtained the distance LY2 between the Y-microscope WY and the axis X. The $\theta$-microscope W$\theta$2 is provided for quickly observing the rotational difference in the wafer at the time of the wafer alignment, which, theoretically speaking, can be accomplished by the Y-microscope WY. Incidentally, since the $\theta$-microscope W$\theta$2 does not satisfy the Abbe condition, it is not so reliable in the strict sense of the word. However, when the wafer rotation is to be detected, both the Y-mark and the $\theta$-mark (alignment marks on the wafer) can be simultaneously observed by the Y-microscope WY and the $\theta$-microscope W$\theta$2, respectively, hence permitting good efficiency in the observation. The Y-mark and $\theta$-mark will be explained in detail hereinafter. The center of observation of the $\theta$-microscope W$\theta$2 is so moved and fixed that the Y-coordinate of the center position of the Y-microscope WY and the Y-coordinate of the center position of the $\theta$-microscope W$\theta$2 may coincide as far as possible. Specifically, the stage S2 is moved in the direction of $-X$, while maintaining the Y-coordinate of the stage S2 fixed until the instant when the horizontal line 10 of the cross mark C2 coincides with the center of observation of the Y-microscope WY in the direction Y, and then it is stopped at a position where the cross mark C2 can be observed through the $\theta$-microscope W$\theta$2. At this position, the center of observation of the $\theta$-microscope W$\theta$2 is shifted (by, for example, tilting a halving glass) for adjustment in such a manner that the center of observation of the $\theta$-microscope W$\theta$2 in the direction Y may coincide with the horizontal line 10 of the cross mark C2. This shifting is done for the purpose of correcting setting errors in the microscopes WY, W$\theta$2 and the relative positional differences of various mechanical parts which arise from use over a long period of time.

By the above-described procedures, the correspondence in positions between the reticle alignment microscopes RX2, RY2 and the wafer alignment microscopes WX, WY, W$\theta$2 can be determined. Therefore, when the reticle R2 is positioned with the reticle alignment microscopes RX2, RY2 as the references, while the wafer is positioned with the wafer alignment microscopes WX, WY, W$\theta$2 as the references, the relative positional relationship between the reticle R2 and the wafer can be established.

Although the reticle alignment microscopes RX2, RY2 have the function of detecting the rotational error of the reticle R2, besides their function of detecting deviation of the reticle R2 in the directions of x and y, explanations thereof will be dispensed with, since the function has no particular bearing on the subject matter of the present invention.

Figure 8:
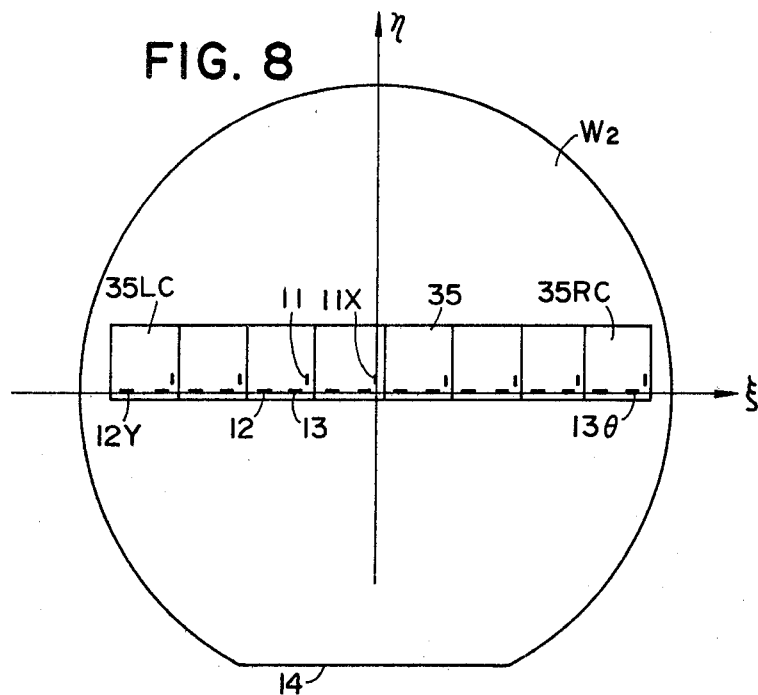
FIG. 8 is a front view of a semiconductor wafer to be positioned by the alignment device according to the preferred embodiment of the present invention.

In the following, explanations will be given as to the wafer alignment method using the device according to the present invention. For the wafer alignment, alignment marks are required to be placed on the wafer. It is therefore assumed that such alignment marks are formed on the wafer along with the patterns at the time of the first exposure and printing by the step-and-repeat system. Specifically, the alignment marks may be provided on the reticle to be used for the first exposure and printing. This state is shown in FIG. 8. In the drawing, square regions 35 are the pattern regions which have been printed on the wafer W2 at the first printing operation. For convenience in explanation, only one particular row of such pattern regions 35 parallel to a flat portion 14 of the wafer W2 is illustrated. The alignment marks are printed in each of the pattern regions 35 as the marks 11, 12 and 13. The mark 11 is a very small and fine line extending in one direction, while the marks 12, 13 are very small and fine lines extending in the direction which orthogonally intersects the linear direction of the mark 11. By the way, the mark 11 is used for alignment of the wafer W2 in its direction X, while the mark 12 is used for the wafer alignment in its direction Y and the mark 13 for the wafer alignment in the direction $\theta$ i.e., against its rotation. Of the pattern regions 35 on the wafer W2, the outermost ones are designated as chips 35LC, 35RC. The chip 35LC is situated at the leftmost end on the wafer W2, and the chip 35RC at the rightmost end thereof. Here, the mark 12 on the chip 35LC will be particularly called "Y-mark" 12Y, the mark 13 on the chip 35RC will be particularly named "$\theta$-mark" 13$\theta$, and the mark 11 on the chip pattern positioned at the center of the wafer W2 will be particularly called "X-mark" 11X (Y-mark 12Y and $\theta$-mark 13$\theta$ are not necessarily limited to one of the chips 35LC, 35RC). Further, the arrangement of the chip pattern regions 35 on the wafer W2 will be represented by the orthogonally intersecting coordinate system $\xi - \eta$. In FIG. 8, the axis $\xi$ of the coordinate system $\xi - \eta$ is determined to pass through the marks 12, 13 on the chip patterns which are arranged in a row at the substantial center of the wafer W2, while the axis $\eta$ will pass through the X-mark 11X. The distance from the center of the Y-mark 12Y on the axis $\xi$ of the coordinate system $\xi - \eta$ to the center of the $\theta$-mark 13$\theta$ is set at a predetermined constant value. In other words, the distance between the two marks 12Y, 13$\theta$ is so determined that the afore-mentioned center of observation of the wafer alignment Y-microscope WY may become the center of the Y-mark 12Y, and the center of observation of the $\theta$-microscope W$\theta$2 may become the center of the $\theta$-mark 13$\theta$. Accordingly, the spacing between the marks 12 and 13 may be determined in advance depending on the number of and arrangement of the chip patterns 35 and their size so that the Y-mark 12Y and θ-mark 13θ may assume their respective positions as illustrated in FIG. 8, when the chip patterns 35 are printed on the wafer W2. These marks may be formed within circuit patterns in the pattern regions, or in the region corresponding to the scribe line at the side of the pattern regions.

In the following, actual procedures for positioning the wafer using the abovementioned alignment marks 11X, 12Y and 13θ will be explained hereinbelow.

Figure 9A:
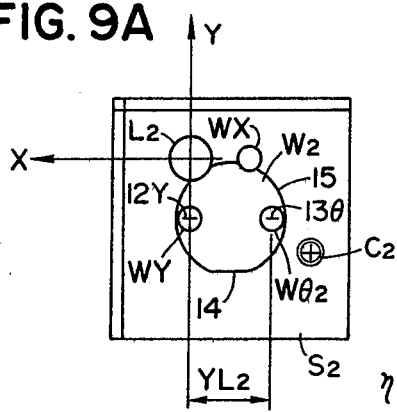
FIG. 9A and 9B are respectively top plan views showing manner of positioning the semiconductor wafer using the positioning device according to the preferred embodiment of the present invention.
Figure 9B:
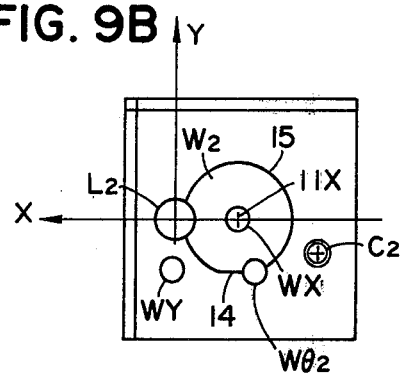

FIG. 9A illustrates a state of alignment of the Y-mark 12Y and θ-mark 13θ on the wafer W2, and FIG. 9B indicates the state of alignment of the X-mark 11X. Other marks than the marks 12Y, 13θ are not shown in FIG. 9A and other marks than the mark 11X are not shown in FIG. 9B. The wafer W2 mounted on the rotational table 32 in FIG. 5 is first subjected to a crude and preliminary alignment to the stage S2 by means of the flat 14. After completion of the crude and preliminary alignment of the wafer W2 by the flat 14, the wafer W2 is fixed on the rotational table 32 (as by vacuum suction, etc.). Thereafter, precise alignment of the wafer W2 is carried out. As shown in FIG. 9A, both Y-mark 12Y and θ-mark 13θ move on the stage so that they become observable through the Y-microscope WY and the θ-microscope Wθ2 to make coincident the Y-mark 12Y and the center of observation of the Y-microscope. Maintaining this coincidence, the abovementioned rotational table 32 is rotated a very small quantity so as to make the center of observation of the θ-microscope Wθ2 coincident with the θ-mark 13θ. Incidentally, it is actually necessary that the wafer W2 be subjected not only to the fine rotation, but also to fine movement in the direction of the axis Y of the stage. In this way, when both Y-mark 12Y and θ-mark 13θ coincide with the observation centers of the microscopes WY, Wθ, respectively, the Y-coordinate of the stage in the coordinate system X-Y can be measured or calculated. (This calculation is sequentially performed by a counting means (e.g. a digital counter) provided in the interferometer.) The value of the Y-coordinate at this instant is taken as Y1.

Figure 10:
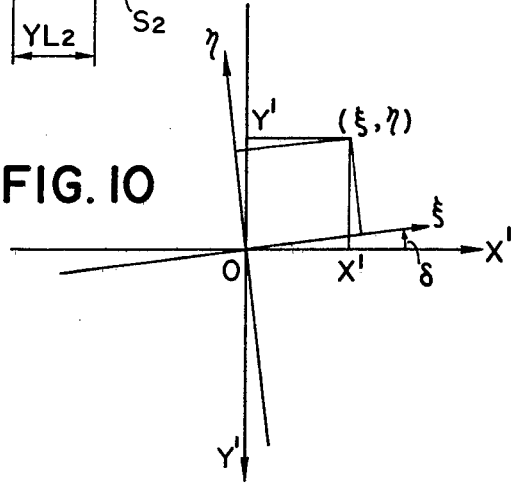
FIG. 10 is a diagram for explaining conversion of a coordinate with rotation of the moving means and the object in the aligning device according to the embodiment of the present invention.

Subsequently, the stage S2 is moved in the direction X alone to thereby observe the θ-mark 13θ by the Y-microscope WY. Thereafter, the stage S2 is moved in the direction Y so that the center of the θ-mark 13θ coincides with the observation center of the Y-microscope WY. The value of the Y-coordinate of the stage at the time of the coincidence is calculated as Y2. From these calculations, there can be found the inclination of the wafer W2 to the coordinate system X-Y, or more particularly, the inclination of the coordinate system $\xi-\eta$ to the coordinate system X-Y. Y1 and Y2 denote the positions of the stage S2 in the coordinate system X-Y. A coordinate system X'-Y' as shown in FIG. 10 is then assumed. It is understood that, in FIG. 10, the coordinate system X'-Y' does not rotate with respect to the coordinate system X-Y and directions of the coordinates X' and Y' are opposite to those of the coordinates X and Y. In more detail, this coordinate system X'-Y' is the one to be established on the stage. When the coordinate values of the stage with respect to the coordinate system X-Y are $(X_0, Y_0)$, the coordinate values of the stage with respect to the system X'-Y' also become $(X_0, Y_0)$. FIG. 10 further illustrates the coordinate system $\xi-\eta$ which has been rotated relative to the coordinate system X'-Y', wherein the origin points of both systems are presumed to be coincident. Accordingly, an angle of inclination δ of the wafer W2 to the coordinate system X'-Y' will be denoted as follows from the values Y1 and Y2 of the Y-coordinate of the stage: $\delta=(Y1-Y2)/YL2$ (where YL2 denotes a distance from the center of the Y-mark 12Y to the center of the θ-mark 13θ as shown in FIG. 9A). It is to be noted that, since the Y-microscope WY is used for measurement of Y1 and Y2, and is disposed to be free from the Abbé error, there is no possibility of systematic error taking place, hence the angle δ also takes an extremely accurate value.

Furthermore, the relationship between the coordinate system X'-Y' and the coordinate system $\xi-\eta$ can be represented as follows, using a condition such that the angle of inclination δ is very small (cos δ≈1, sin δ≈δ):

$$X'=\xi-\delta\cdot\eta$$

$$Y'=-\delta\cdot\xi-\eta$$

As shown in FIG. 10, the above equation is used to convert the coordinate values $(\xi, \eta)$ of the coordinate system $\xi-\eta$ to the coordinate values $(X', Y')$ of the coordinate system X'-Y'.

Thus, when calculation of the angle of inclination δ has been completed, the value of the Y-counting means provided in the interferometer 34 for calculating the Y-coordinate of the stage S2 is preset at a fresh value. This fresh value is introduced in the following manner. Assume that the stage S2 is at its arbitrary coordinate values of the coordinate system X-Y. A value corresponding to $-LY2+\frac{1}{2}\cdot\delta\cdot YL2-Y1$ (or $-LY2-\frac{1}{2}\cdot\delta\cdot YL2-Y2$) is added to the Y-coordinate values of the stages S2 which the counting means holds at that time, and the value after this addition is taken as the fresh value. Incidentally, it is understood here that the coefficient in the second term of the equation is given as "$\frac{1}{2}$" for the purpose of taking an intermediate point between the Y-mark 12Y and the θ-mark 13θ (though this point does not always coincide with the origin of the coordinate system $\xi-\eta$, it is assumed to be so for the sake of explanation) as the reference.

By the abovementioned operations, the origin of the coordinate system $\xi-\eta$ of the wafer W2 can be made coincident with the axis X of the coordinate system X-Y.

Next, correspondence between the X-coordinate of the stage S2 and the coordinate system $\xi-\eta$ is realized in the following manner. As shown in FIG. 9B, the stage S2 is moved in such a manner that the X-mark 11X may pass through the center of observation of the X-microscope WX. When the X-mark 11X and the observation center of the X-microscope become coincident, the X-counting means of the interferometer 33 is preset at $-LX2$. By this operation, when the stage S2 is moved in the direction X, for example, so as to render the counted value of the X-counting means to be zero, the origin of the coordinate system $\xi-\eta$ of the wafer W2 coincides with the axis Y of the coordinate system X-Y.

By the abovementioned two operations, there can be obtained the correspondence between the coordinate system $\xi-\eta$ and the coordinate system X-Y. In case the stage S2 is actually moved to project the patterns of the reticle R2 on the wafer W2, the stage S2 is caused to move along the coordinate system $\xi-\eta$ of the wafer W2. That is to say, in order to position any arbitrary points $(\xi_0, \eta_0)$ of the coordinate system $\xi-\eta$ on the origin of the coordinate system X-Y (i.e. the center of projection by the projection lens L2), the stage S2 may be moved in such a manner that the X-Y coordinate values of the stage S2 become $(\xi_0 - \delta \cdot \eta_0, -\delta \cdot \xi_0 - \eta_0)$.

Since rotation of the wafer W2 with respect to the moving direction of the stage S2 (the axes X, Y of the coordinate system X-Y), i.e., the wafer rotation, can be rectified in the abovementioned manner, the exposure and printing can be done with accurate positioning. However, if there exists a rotational difference for each chip pattern to be projected (this is termed "chip rotation"), there remains an error component due to the chip rotation as the positioning error, even when the wafer rotation is rectified. For instance, there can be contemplated a case wherein rotation exists with respect to the reticle at the time of the first printing. This will be explained in reference to FIG. 11.

Figure 11:
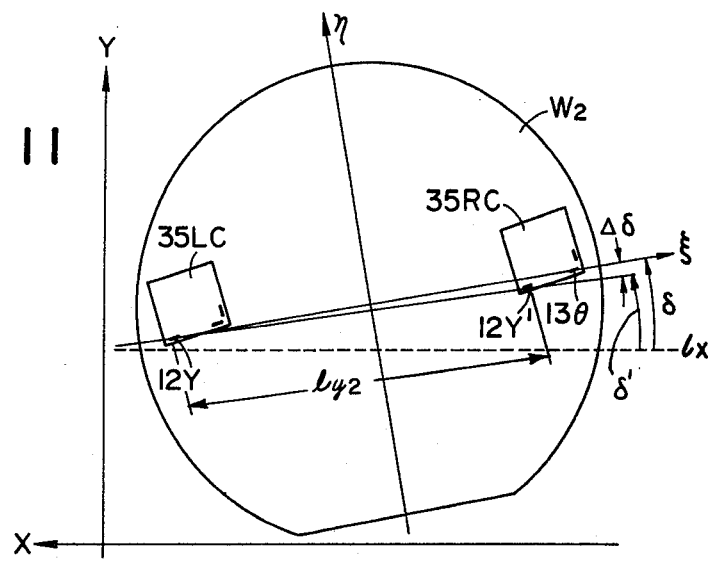
FIG. 11 is a diagram for explaining rotation of a chip pattern on the semiconductor wafer.

In FIG. 11, the coordinate system X-Y and the coordinate system $\xi - \eta$ of the wafer W2 are assumed to be rotating at the angle of inclination $\delta$. In the drawing, a broken line lx is the rectilinear line parallel with the axis X, and an angle which the broken line lx and the axis $\xi$ form constitutes the angle $\delta$. As has been explained in the foregoing, determination of the axis $\xi$ of the coordinate system $\xi - \eta$ is done in such a manner that it may pass through the Y-mark 12Y of the chip 35LC and the $\theta$-mark 13$\theta$ of the chip 35RC. Further, calculation of the angle of inclination $\delta$ is based on the Y-coordinate value Y1 of the Y-mark 12Y and the Y-coordinate value Y2 of the $\theta$-mark 13$\theta$, which have been observed through the Y-microscope WY. This signifies that even when a position of any arbitrary chip pattern 35 on the wafer W2 is printed by correcting the angle of inclination $\delta$ as mentioned above with the position of the chip 35LC, for example, as the reference, there would remain an error $\Delta\delta$ due to the chip rotation of chip 35 RC which is away from the chip 35LC. Also, the marks for calculating the values Y1, Y2 correspond in general to the Y-mark 12Y and $\theta$-mark 13$\theta$ provided at different positions on the reticle.

In the method wherein the inclination angle $\delta$ is obtained from the Y-mark 12Y and the $\theta$-mark 13$\theta$, since magnification error and distortion in the projection lens L2 have an adverse influence on the marks 12Y and 13$\theta$ and therefore on the inclination angle $\delta$, correction of the wafer rotation by means of the angle $\delta$ involves an error.

Figure 12:
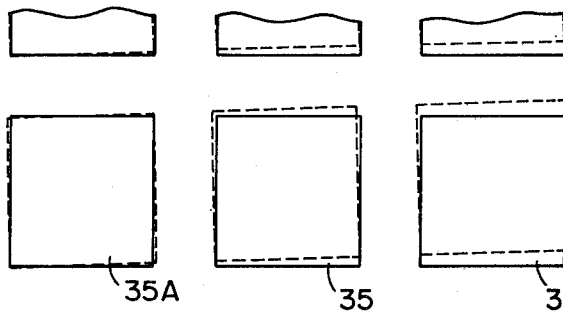
FIG. 12 is a diagram showing a layout of the chip pattern registered by the conventional positioning device.
Figure 13:
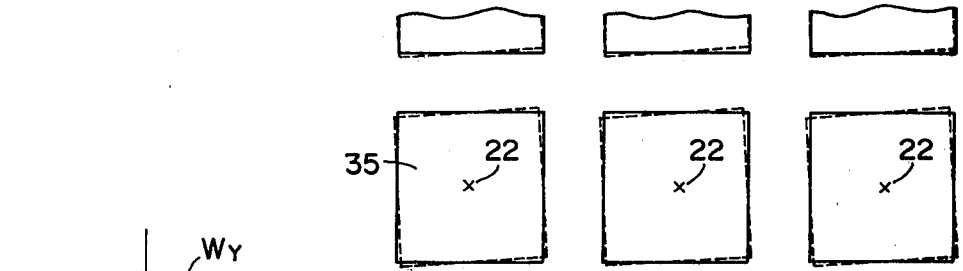
FIG. 13 is a diagram showing a layout of the chip pattern registered by the aligning device according to the preferred embodiment of the present invention.

In order therefore to remove such errors and adverse influence, it may be sufficient that, at the time of calculating the angle of inclination, the Y-coordinate value when the center of observation of the Y-microscope WY becomes coincident with the Y-mark 12Y of the chip 35 LC is taken as Y1, and the Y-coordinate value when the center of observation of the Y-microscope WY becomes coincident with the Y-mark 12Y' of the chip 35 RC by moving the stage is taken as Y2. In this case, if the distance from the center of the Y-mark 12Y of the chip 35 LC to the center of the Y-mark 12Y' of the chip 35 RC is ly2, the angle of inclination $\delta'(=\delta-\Delta\delta)$ can be obtained from the following equation: $\delta' = (Y1-Y2)/ly2$. By using the value $\delta'$ instead of the value $\delta$, the wafer rotation is rectified without adverse influences of the chip rotation and the magnification and distortion of the projection lens L2. As the consequence of this, the inclination angle $\delta'$ obtained from Y-marks 12Y and 12Y' results in more accurate alignment than the inclination angle $\delta$ obtained from Y-mark 12Y and $\theta$-mark 13$\theta$. By thus rectifying the stage positioning by the use of the angle of inclination $\delta$ or $\delta'$, it becomes possible to reduce the alignment error. This will be explained in reference to FIGS. 12 and 13. In the drawings, solid lines indicate a printed pattern of the n'th layer, and broken lines denote a pattern of the (n+1)th layer. The squares 35 represent the patterns which are transferred by one projection. When no angle of inclination $\delta$ or $\delta'$ is used for correction in positioning the stage, the alignment error becomes minimum at one projected portion 35A on the wafer, as shown in FIG. 12. However, the projected portion 35 separated from the projected portion 35A has an alignment error which increases in proportion to the distance separated. In the alignment device according to the present invention, when the angle of inclination $\delta$ or $\delta'$ is used for correcting the stage positioning, the errors from the rotational difference disappear at the center part 22 of the projected pattern 35 for one exposure. There remains only an error due to rotation of each projected pattern 35 per se and the projected patterns 35 arranged in a lateral direction have the same difference between the n'th exposure pattern and the (n+1)th exposure pattern.

While the precision in the wafer alignment can be improved by the above-described method, the wafer is not perfectly horizontal on the stage, because it is generally in a tapered shape. It also happens that the wafer has a surface irregularity of a few micrometers or more due to various treatments such as etching, heating, and so on. Further, the microscope for the wafer alignment is fitted, in most cases, onto the alignment device in the direction of depth of focus, and with a very small inclination due to adjustment error. These bring about a calculation error for Y1 and Y2 when the angle of inclination $\delta$ (or $\delta'$) of the wafer is to obtained. Therefore, at the time of calculating Y1, Y2, automatic focussing is effected by the Y-microscope WY. Concretely, every time the Y-microscope WY observes an alignment mark on the wafer, the stage is moved up and down so as to bring it to an in-focus state with the mark.

Figure 14:
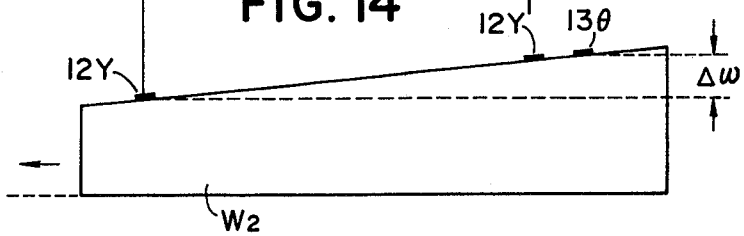
FIG. 14 is a diagram for explaining an aligning error in the aligning device according to the preferred embodiment of the present invention, where there exist differences in height among a plurality of marks for aligning the wafer.

This will be explained in reference to FIG. 14. It is assumed that the surface of the wafer W2 is inclined with respect to the moving direction of the stage as indicated by the arrow, and the Y-mark 12Y and the $\theta$-mark 13$\theta$ have a difference in height $\Delta\omega$. It is also assumed that the optical axis of the Y-microscope WY is inclined by an angle $\alpha$ in a plane which contains the measuring axis Y and which is perpendicular to the measuring axis X, i.e., in a plane perpendicular to the plane of the drawing of FIG. 14. As mentioned in the foregoing, the Y-mark 12Y is observed through the Y-microscope WY to find out the coordinate value Y1, after which the stage is moved in the arrow direction to further observe the $\theta$-mark 13$\theta$ or the Y-mark 12Y' to thereby find out the coordinate value Y2. At this time, the Y-microscope WY equally detects the Y-mark 12Y and the $\theta$-mark 13$\theta$ or the Y-mark 12Y', although there unavoidably occurs an error between the coordinate values Y1 and Y2 due to difference in height $\Delta\omega$. This error is denoted by $\Delta\omega \cdot \alpha$, and, when, for example, $\alpha = 1/100$, and $\Delta\omega = 5$ $\mu$m, it becomes 5/100 $\mu$m. Therefore, when the alignment marks are observed through the Y-microscope WY, the automatic focussing is effected so that the Y-microscope WY may observe the marks at the same height (i.e. in-focus with any mark). Accordingly, any influence due to the inclination $\alpha$ becomes theoretically eliminated.

Here, if the precision in the automatic focussing is $\pm 0.5$ $\mu$m, the error under the conditions of $\alpha = 1/100$ and Δω=5 μm becomes ±5/1,000 μm, which is practically negligible.

In the foregoing explanations of the embodiment of the present invention, the Y-microscope WY, the θ-microscope Wθ2, and the X-microscope WX are of such a type that the reference marks are incorporated in the real image forming planes thereof, and the observation is done by the naked eye either directly through the ocular lens or indirectly through an ITV display monitor. It is, of course, possible for the alignment marks to be detected by photo-electric edge sensors or line sensors. For the photoelectric sensors, there may be enumerated those image pick-up elements such as photoelectric microscopes, laser rectilinear scanning type or vibration scanning type sensors, ITV, and so on. An embodiment of the positioning device, wherein the photoelectric sensor is utilized, is more complicated in construction than that depending on the naked-eye observation, but it has such advantages that operators of the device suffer less from fatigue, and the precision can be maintained constant.

Incidentally, when the marks are to be detected photoelectrically, the counting means in the interferometers may be preset at predetermined coordinate values depending on the detected signals. Further, each device operation, calculation and computation, and presetting of the above-mentioned counting means are controlled by micro-computers, etc. Furthermore, the positioning device as described so far is not only useful in the scale-reduction and projection type exposure device as shown in the embodiment of the present invention, but is also applicable to the contact type and proximity type exposure devices, as well as to a printing device using photon rays, and particle rays (X-ray, electron ray).

We claim:

1. An alignment device for aligning an object to a predetermined position, comprising moving means adapted to mount the object thereon and to move in first and second orthogonal directions X and Y, respectively, the object having first and second marks thereon with a predetermined separation therebetween, the marks being located on a line substantially parallel to the X direction, and having a third mark located thereon at a position different from the first and second marks; coordinate measuring means having orthogonal measuring axes X and Y which are parallel to the X and Y directions, respectively, for measuring the position of the moving means; first observing means having a first observation center coincident with the Y measuring axis for detecting the first mark; second observing means having a second observation center which is not coincident with either of the measuring axes X and Y for detecting the second mark, the first and second observation centers lying on a line segment that is parallel to the X measuring axis and the distance between the first and second observation centers being substantially equal to the separation between the first and second marks; and third observing means having a third observation center coincident with the X measuring axis; the coordinate measuring means having means for measuring the location of said moving means in the Y direction when the first and second observing means detect the first and second marks, respectively, and having means for measuring the location of the moving means in the X direction when the third observing means detects the third mark, thereby establishing the location of the object with respect to the X and Y measuring axes.

2. The device of claim 1, wherein the moving means has a rotational portion upon which the object is mounted, the rotational portion moving integrally with the moving means and being relatively rotatable with respect thereto, the rotational portion being adapted to rotate the object to a position in which the first and second marks are detected simultaneously by the first and second observing means, respectively.

3. An alignment device for an exposure apparatus in which a pattern is aligned with and printed onto an object, comprising a projection optical system for projecting the pattern onto the object; moving means upon which the object is mounted for moving the object in first and second orthogonal directions X and Y; coordinate measuring means having X and Y measuring axes that are respectively parallel to said X and said Y directions and having means for detecting the position of the moving means, the measuring axes intersecting at a point that coincides with the optical axis of the projection optical system; first observing means having a first observation center coincident with the Y measuring axis for detecting a first mark on the object; second observing means having a second observation center which is not coincident with either of said measuring axes for detecting a second mark on the object, the first and second observation centers lying on a line segment that is parallel to the X measuring axis; and third observing means having a third observation center coincident with the X measuring axis for detecting a third mark on the object.

4. The device of claim 3, wherein the distance between the first and second marks is substantially equal to the distance between the first and second observation centers, and said coordinate measuring means includes means for measuring the position of the moving means in the Y direction when the first and second marks are detected simultaneously by the first and second observing means, respectively, and includes means for measuring the position of the moving means in the X direction when the third mark is detected by the third observing means.

5. An alignment method for a step-and-repeat exposing method for repetitively printing a pattern on an object by successively moving the object in orthogonal X and Y directions and exposing the pattern thereon, wherein the object has at least two key marks having a predetermined separation and being located on a predetermined line generally parallel to the X direction, and wherein coordinate measuring means having two measuring axes X and Y parallel to the X and Y directions, respectively, measures the position of a moving means upon which the object is mounted, and observing means for observing the key marks has an observation center coincident with the Y measuring axis, the method comprising moving the moving means to coincide a first one of the key marks with the observation center and measuring a first value representative of the position of the object in the Y direction; moving the moving means to coincide the other of said key marks with the observation center and measuring a second value representative of the position of the object in the Y direction; employing said measured values and said predetermined separation between key marks to determine the inclination of the predetermined line on which the key marks are located with respect to the X axis; and thereafter successively positioning the object for exposure of the pattern thereon by moving the moving means in the X and Y directions so as to cause the object to move in a direction that has the same inclination with respect to the X axis as said predetermined line to compensate for positioning errors due to said inclination.

6. The method of claim 5, wherein the object has formed thereon a plurality of areas to be exposed, each area having first and second marks lying along said predetermined line, and wherein any pair of said marks is used as the key marks.

7. The method of claim 6, wherein the first mark in a first area and the second mark in a second area separated from the first area and lying along said predetermined line are used as the key marks.

8. The method of claim 6, wherein the first mark in a first area and the first mark in a second area separated from the first area and lying along the predetermined line are used as the key marks.

* * * * *